United States Patent
Goda et al.

(10) Patent No.: US 6,703,669 B1
(45) Date of Patent: Mar. 9, 2004

(54) SEMICONDUCTOR DEVICE HAVING SERIALLY CONNECTED MEMORY CELL TRANSISTORS PROVIDED BETWEEN TWO CURRENT TERMINALS

(75) Inventors: Akira Goda, Yokohama (JP); Kazuhiro Shimizu, Yokohama (JP); Riichiro Shirota, Fujisawa (JP); Norihisa Arai, Omiya (JP); Naoki Koido, Yokohama (JP); Seiichi Aritome, Yokohama (JP); Tohru Maruyama, Yokohama (JP); Hiroaki Hazama, Hachioji (JP); Hirohisa Iizuka, Centreville, VA (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/714,228

(22) Filed: Nov. 17, 2000

(30) Foreign Application Priority Data

Nov. 18, 1999  (JP) .......................... H11-328149

(51) Int. Cl.⁷ ............................................. H01L 29/788
(52) U.S. Cl. ........................................ 257/390; 257/316
(58) Field of Search ................................ 257/315–326, 257/365, 390, 391; 365/185.01–185.33; 438/257–267

(56) References Cited

U.S. PATENT DOCUMENTS

| 4,931,847 | A | * | 6/1990 | Corda | ................... 365/185.28 |
|---|---|---|---|---|---|
| 5,190,888 | A | * | 3/1993 | Schwalke et al. | ............ 438/510 |
| 5,237,188 | A | * | 8/1993 | Iwai et al. | ................... 257/325 |
| 5,324,974 | A | * | 6/1994 | Liao | ............................ 257/344 |
| 5,734,607 | A | * | 3/1998 | Sung et al. | ............. 365/185.01 |
| 5,877,980 | A | * | 3/1999 | Mang | ..................... 365/185.17 |
| 6,160,297 | A |   | 12/2000 | Shimizu et al. | |

FOREIGN PATENT DOCUMENTS

| JP | 64-5067 | 1/1989 |
|---|---|---|
| JP | 11-111868 | 4/1999 |
| JP | 2000-58680 | 2/2000 |
| JP | 2000-196046 | 7/2000 |

* cited by examiner

Primary Examiner—Wael Fahmy
(74) Attorney, Agent, or Firm—Oblon, Spivak, McClelland, Maier & Neustadt, P.C.

(57) ABSTRACT

A semiconductor device exhibits a stable driving force and high performance reliability. The semiconductor device has at least one transistor having a gate insulating film formed on a element region in a semiconductor substrate, a gate electrode formed on the gate insulating film, and a diffused layer in element regions on both sides of the gate electrode. The device also has a barrier insulating film formed so as to cover the transistor and the diffused layer. The height from a surface of the semiconductor substrate to the barrier insulating film is greater than the height from the surface, of the interface between the gate insulating film and the gate electrode.

18 Claims, 14 Drawing Sheets

SILICON ON DIFFUSED LAYER

|   | BETWEEN CELLS | CONTACT BOTTOM |
|---|---|---|
| 1) | IMPURITY DOPING | IMPURITY DOPING |
| 2) | NO IMPURITY DOPING | IMPURITY DOPING |
| 3) | SILICIDE | SILICIDE |

SEMICONDUCTOR DEVICE HAVING SERIALLY CONNECTED MEMORY CELL TRANSISTORS PROVIDED BETWEEN TWO CURRENT TERMINALS

CROSS REFERENCE TO RELATED APPLICATIONS

This application claims the benefit of the earlier filing date of patent application Ser. No. 1999-328149, filed Nov. 18, 1999, in Japan. The entire disclosure of the prior application is considered as part of the disclosure of the accompanying application as hereby incorporated by reference herein.

BACKGROUND OF THE INVENTION

1. Field of the Invention

The present invention relates to a semiconductor device.

2. Description of Related Art

A well-known semiconductor device is described with reference to FIGS. 10 to 13.

This semiconductor device is a NAND cell-type EEPROM as one of electrically-rewritable and -erasable non-volatile semiconductor devices.

FIG. 10 shows an equivalent circuit of the EEPROM. FIG. 11 illustrates its layout. FIGS. 12 and 13 are sectional views taken along the lines A–A' and B–B', respectively, in FIG. 11.

The NAND cell-type EEPROM is provided with NAND cell sections $40_{11}$, $40_{12}$, $40_{21}$ and $40_{22}$ arranged in a matrix, as shown in FIG. 10. Each NAND cell section $40_{ij}$ (i=1, 2, j=1, 2) has memory cells $MC_1$, $MC_2$, ..., and $MC_n$. Each memory cell $MC_i$ (i=1, ..., n) is made up of a stacked transistor having a floating gate 6 and a control gate 8 stacked on a semiconductor substrate 2 via an insulating film 7, as shown in FIGS. 10 and 12. The memory cells $MC_1$, ..., and $MC_n$ in each NAND cell section are connected in series to share the source and drain between adjacent memory cells.

Each NAND cell section $40_{ij}$ (i=1, 2, j=1, 2) has a drain connected to a bit line $BL_j$ via a selection transistor $SDT_{ij}$ and a source connected to a source line $SL_j$ via a selection transistor $SST_{ij}$. The source line $SL_j$ (j=1, 2) is formed by diffused layer interconnection, having a source-line contact 44 thereon, as shown in FIGS. 11 and 12.

The sources of the selection transistors $STD_{1j}$ and $STD_{2j}$ connected to the NAND cell sections $40_{1j}$ and $40_{2j}$ (j=1, 2) aligned in the column direction are connected to the bit line $BL_j$ via a bit-line contact $42_j$, as shown in FIGS. 10 and 11.

The control gate of the memory cell$_k$ (k=1, ..., n) of each of the NAND cell sections $40_{11}$ and $40_{12}$, and $40_{21}$ and $40_{22}$ aligned in the traverse, respectively, is connected to a word line $WL_k$.

The gates of the selection transistors $SDT_{11}$ and $SDT_{12}$ are connected to a selection line $SD_1$, and those of the selection transistors $SDT_{21}$ and $SDT_{22}$ are connected to a selection line $SD_2$, as shown in FIG. 10.

The gates of the selection transistors $SST_{11}$ and $SST_{12}$ are connected to a selection line $SS_1$, and those of the selection transistors $SST_{21}$ and $SST_{22}$ are connected to a selection line $SS_2$, as shown in FIG. 10.

The NAND cell section $40_{ij}$ (i=1, 2, j=1, 2), the selection transistors $SDT_{ij}$ (i=1, 2, j=1, 2) and $SST_{ij}$ (i=1, 2, j=1, 2) and also a silicon nitride film 12 are covered with an interlayer dielectric 22 formed on which are the bit line$_i$ (i=1, 2), as shown in FIGS. 12 and 13.

Each memory cell, selection transistor and also a element isolation region 4 of the well-known EEPROM are covered with the silicon nitride film 12 that will act as a barrier insulating film for contact formation.

This structure offers miniaturization of bit-line and source-line contact regions (diffused layer regions) and protection of the element isolation region 4 including silicon oxide adjacent to the contact regions from dielectric breakdown which would otherwise occur, such that, a contact in the interlayer dielectric 22, for example, a contact 422 punches therethrough and electrically contact with the semiconductor substrate 2, as illustrated in FIG. 13.

As illustrated in FIG. 14, each memory cell of the well-known EEPROM is formed such that an interface 82 between the silicon nitride film 12 and a silicon oxide film 5a on a diffused layer 9 is located under (at the substrate 2 side) an interface 84 between the floating gate 6 and a gate insulating film 5.

As described, each memory cell of the well-known semiconductor device is covered with a silicon nitride film.

The well-known semiconductor device has, however, drawbacks as discussed below.

First of all, as illustrate in FIG. 14, in data-writing/erasing, carriers pass through the gate insulating film 5 and some of them are trapped by the silicon nitride film 12 close to the gate insulating film 5 and also the interface 82 between the silicon nitride film 12 and the silicon oxide film 5a.

This causes induction of carriers of the opposite polarity on the surface of the diffused layer 9 to increase parasitic resistance to the layer 9, thus reducing a transistor driving force. Increase in parasitic resistance to the diffused layer of a NAND cell-type EEPROM poses a big problem because it has memory cells series-connected via the layer 9.

Such parasitic resistance further increases to affect miniaturization of memory cells when decreasing a dose of ions to the diffused layer for reduction of short channel effect.

A numeral 10 in FIG. 14 represents a silicon oxide film formed by post-oxidation for recovery from damage to the device caused by gate formation.

Another drawback to the well-known semiconductor device is that hydrogen involved in the silicon nitride film 12 degrades the gate insulating film 5 close to the film 12, thus lowering reliability in transistor performance.

SUMMARY OF THE INVENTION

A purpose of the present invention is to provide a semiconductor device that is protected from reduction in transistor driving force and reliability.

The present invention provides a semiconductor device including: at least one transistor having a gate insulating film formed on a element region in a semiconductor substrate, a gate electrode formed on the gate insulating film, and a diffused layer in element regions on both sides of the gate electrode; and a barrier insulating film formed so as to cover the transistor and the diffused layer, wherein a height from a surface of the semiconductor substrate to the barrier insulating film is greater than a height from the surface of the semiconductor substrate, of an interface between the gate insulating film and the gate electrode.

An inter-film may be formed between the diffused layer and the barrier insulating film.

The inter-film may be made of a material different from that of the barrier insulating film.

The semiconductor substrate may be made of silicon and the barrier insulating film may be made of silicon nitride.

The inter-film may include silicon oxide.

The inter-film may be made of a conductive material.

The inter-film may include silicon doped impurities of the same conductive type as that of the diffused layer.

The inter-film may include a silicide.

The inter-film is preferably thicker than the gate insulating film.

The present invention provides a semiconductor device including: at least one transistor having a gate insulating film formed on a element region in a semiconductor substrate, a gate electrode formed on the gate insulating film, and a diffused layer in element regions on both sides of the gate electrode; and a barrier insulating film formed so as to cover the transistor and the diffused layer, a distance between a side face of the gate electrode and the barrier insulating film being larger than a thickness of the gate insulating film.

The transistor may make up of a memory cell of an EEPROM.

DETAILED DESCRIPTION OF PREFERRED EMBODIMENTS

Preferred embodiments according to the present invention will be disclosed with reference to the attached drawings.

Elements in the embodiments that are the same as or analogous to elements in the well-known device are referenced by the same reference numbers.

The First Preferred Embodiment

Figure 1:
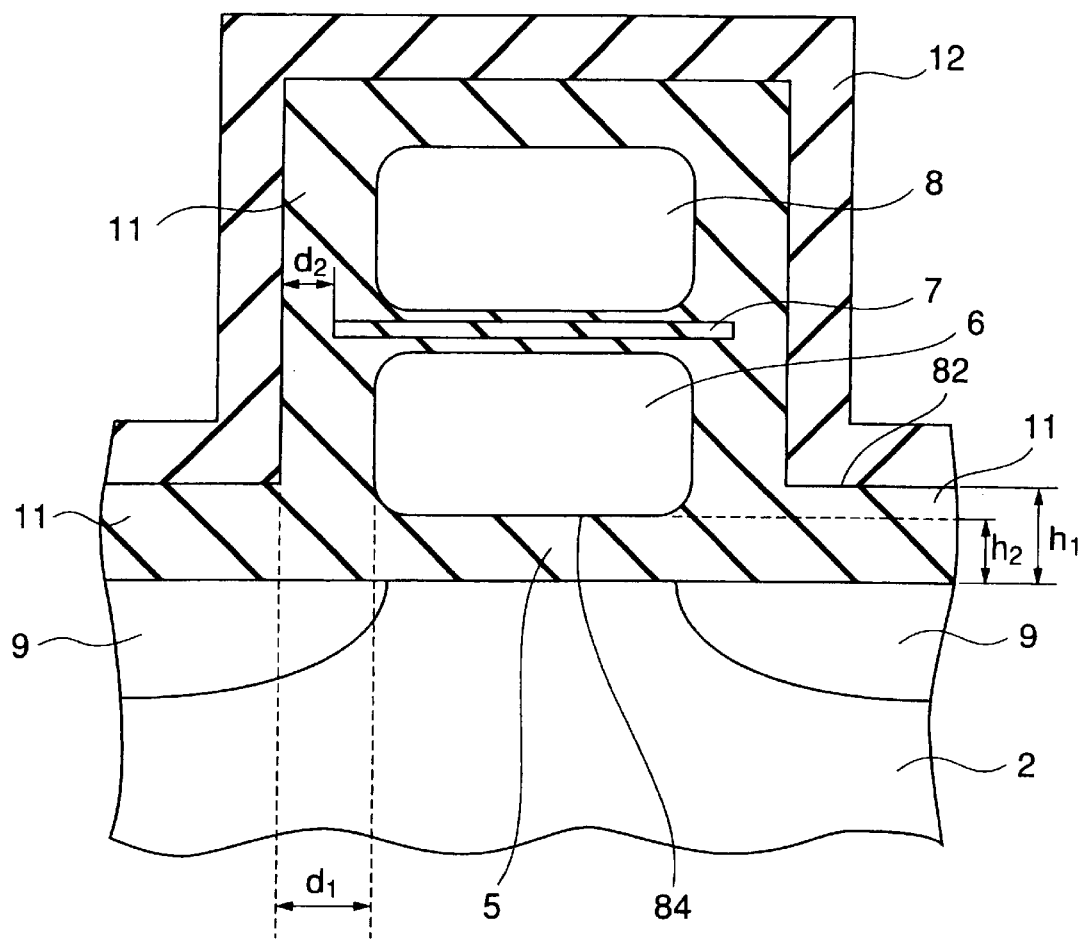
FIG. 1 is a sectional view of a structure of a semiconductor device as the first preferred embodiment according to the present invention.

FIG. 1 illustrates a structure of a semiconductor device as the first preferred embodiment according to the present invention.

The semiconductor device is a transistor including a gate electrode that has a floating gate 6 and a control gate 8 stacked thereon via an insulating film 7, being used as, for example, a memory cell for EEPROM.

The gate electrode is formed on a element region of a semiconductor substrate 2 via a gate insulating film 5 made of, for example, a tunnel oxide film. Formed in the element regions under the both sides of the gate electrode are diffused layers 9 acting as a source and a drain. The gate electrode is covered with an insulating film 11 made of, for example, a silicon oxide film, which is further covered with a silicon nitride film 12 acting as a barrier insulating film for contact formation.

In this transistor, a height $h_1$ (from the surface of the semiconductor substrate 2) of an interface 82 between the insulating film 11 on a diffused layer 9 and the silicon nitride film 12 is higher than a height $h_2$ (from the substrate surface) of an interface 84 between the gate insulating film 5 and the floating fate 6. In other words, the interface 82 is formed apart from the semiconductor substrate 2 more than the interface 84.

Moreover, a distance $d_1$ (the thickness of the insulating film 11) between the side face of the floating gate electrode 6 and the interface between the film 11 and the barrier insulating film 12 is larger than the height $h_2$ of the interface 84 from the surface of the semiconductor substrate 2.

The transistor structure, with the height $h_1$ of the interface 82 higher than the height $h_2$ of the interface 84 and the thickness $d_1$ of the insulating film 11 larger than the height $h_2$, provides the silicon nitride film 12 as being apart from the gate insulating film 5 more than the well-known device.

This structure protects carriers passing through the gate insulating film 5 in data-writing/erasing from being trapped in the vicinity of the interface 82 (the region represented by a sign "R" in FIG. 15A), which obstructs parasitic resistance to the diffused layer 9 to increase, thus preventing a driving force of the transistor from decreasing.

Moreover, the transistor structure on the heights $h_1$ and $h_2$, and the thickness $d_1$ providing the silicon nitride film 12 apart from the gate insulating film 5 more than the well-known device prevents degradation of the gate insulating film 5, thus preventing transistor reliability from lowering.

Figure 15A:
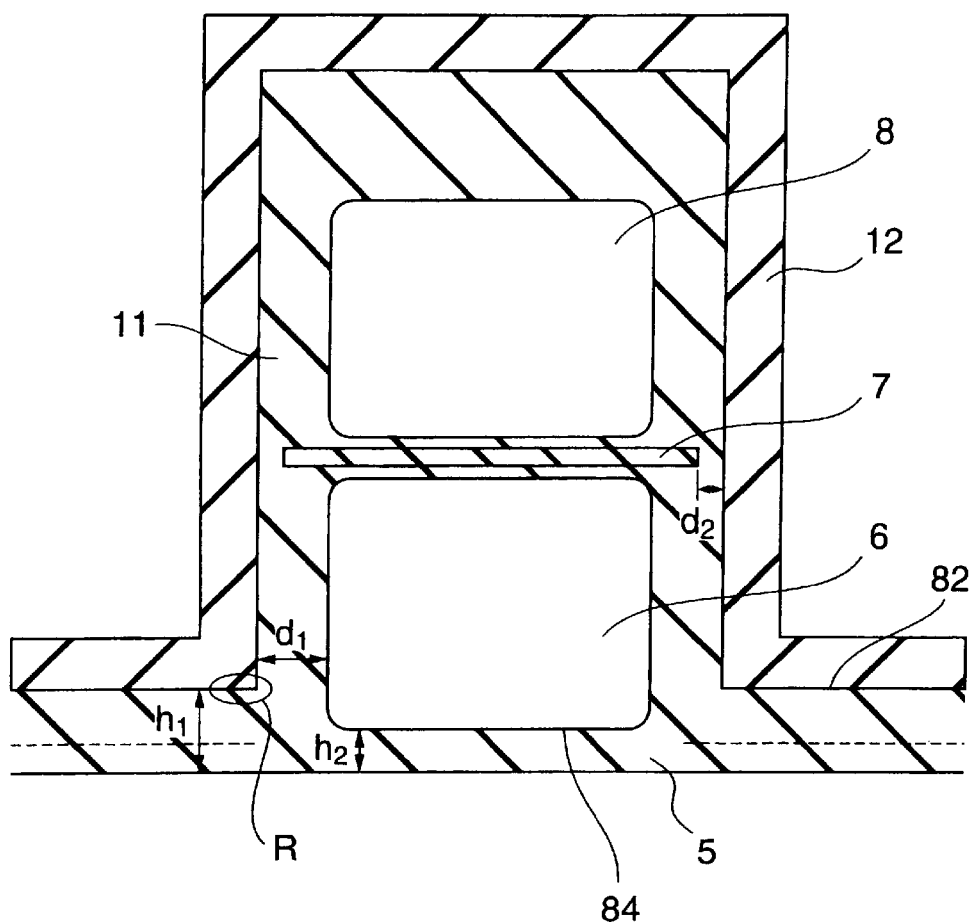
FIGS. 15A to 15C illustrate the features of the present invention.

The embodiment provides the transistor structure in that the height $h_1$ of the interface 82 is higher than the height $h_2$ of the interface 84 and the thickness $d_1$ of the insulating film 11 is larger than the height $h_2$ of the interface 84 from the substrate surface, as illustrated in FIG. 15A.

Figures 15B, 15C:
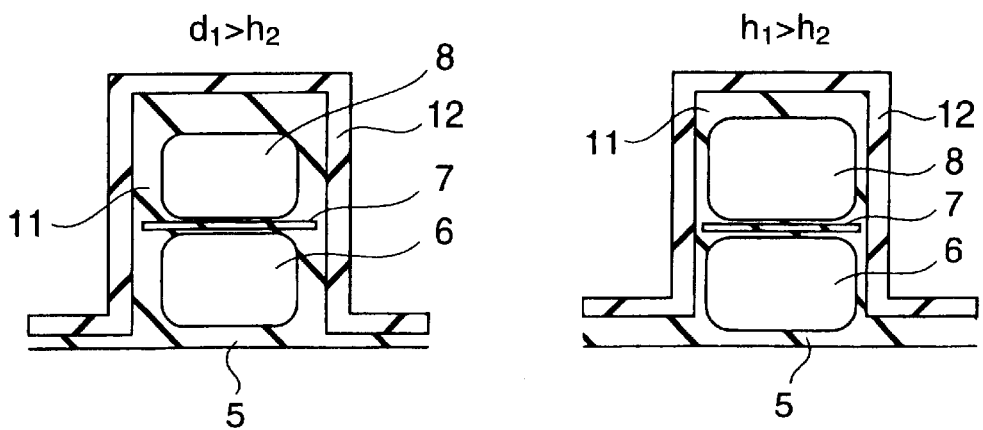

As shown in FIG. 15B, however, a transistor structure only with the thickness $d_1$ larger than the height $h_2$ also provides the silicon nitride film 12 as being apart from the gate insulating film 5 more than the well-known device, thus being advantageous like the embodiment.

Not only that, as shown in FIG. 15C, another transistor structure only with the height $h_1$ higher than the height $h_2$ also provides the silicon nitride film 12 as being apart from the gate insulating film 5 more than the well-known device, thus being advantageous like the embodiment.

The reason for the advantages given by the modifications shown in FIGS. 15B and 15C is explained below.

Generally, carriers exist in the semiconductor substrate 2 and the floating gate 6, in writing/erasing, carrying energy enough for passing through the tunnel insulating film 5 having the thickness $h_2$.

A height $h_1$ or a distance $d_1$ smaller than the thickness $h_2$ of the tunnel insulating film 5 thus cause some carriers being trapped in the barrier insulating film 12 or the interface between the film 12 and an inter-film (the insulating film 11 in the embodiment) provided between the diffused layer 9 and the film 12.

On the contrary, a height $h_1$ or a distance $d_1$ larger than the thickness $h_2$ protects carriers, in writing/erasing, from being trapped in the barrier insulating film 12 or the interface between the film 12 and the inter-film 11.

As discussed above, in writing/erasing, carriers are protected from being trapped in the barrier insulating film 12 or the interface between the film 12 and the inter-film 11, thus the transistor structures disclosed above are protected from increase in parasitic resistance to the diffusion layer 9.

Figure 16:
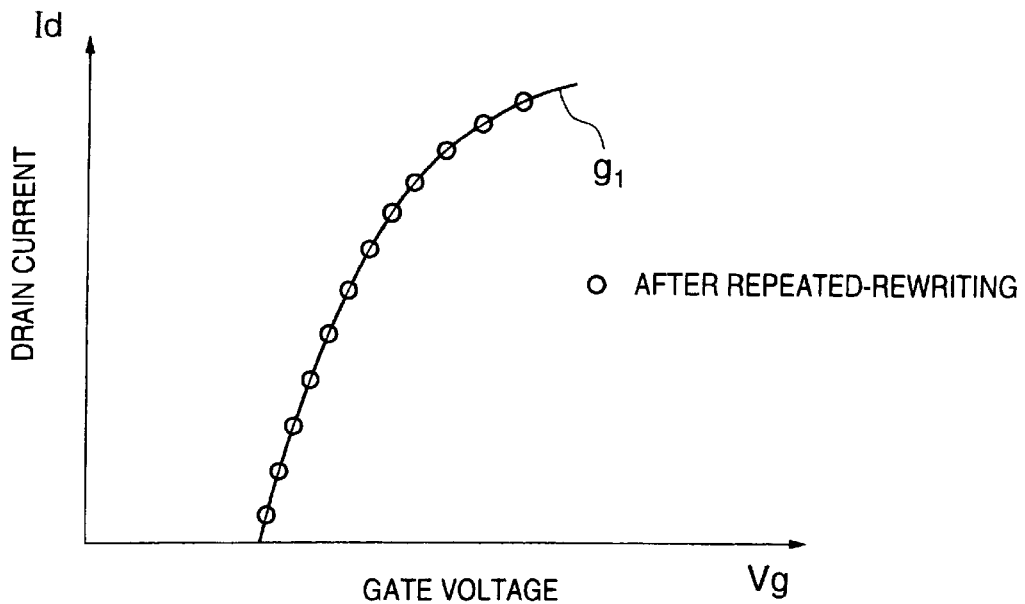
FIG. 16 is graph representing the characteristics of the present invention.

The semiconductor device of the embodiment therefore exhibits no variation in gate voltage Vg-to-drain current Id characteristics against repeated writing/erasing, as shown in FIG. 16.

Figure 17:
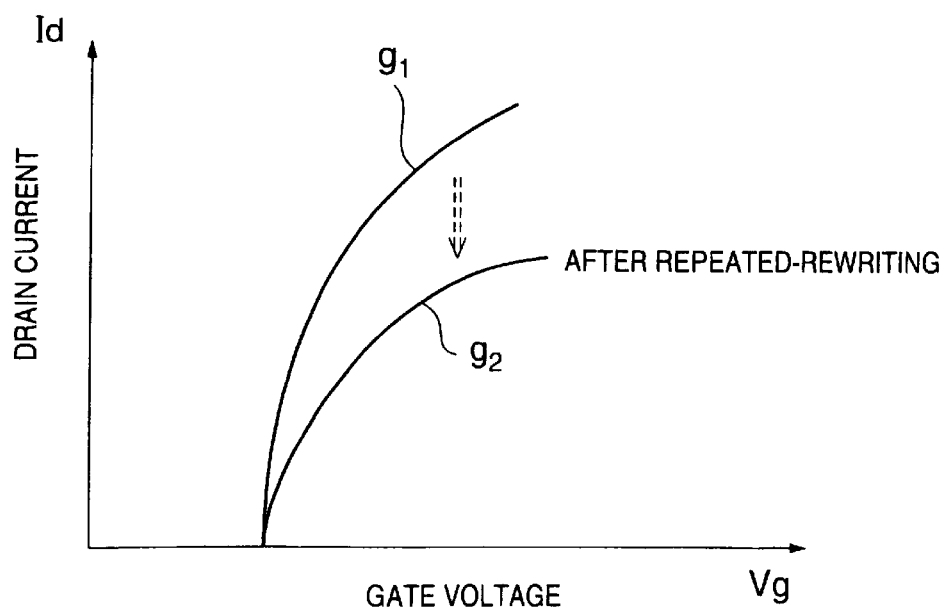
FIG. 17 is graph representing the characteristics of the well-known device.

Contrary to this, the well-known device suffers from degradation in Vg-Id characteristics, such as, from a graph $g_1$ to a graph $g_2$, as shown in FIG. 17, due to repeated writing/erasing that causes carrier trapping to the barrier insulating film or the interface between this film and the inter-film. In FIG. 17, the graphs $g_1$ and $g_2$ show the Vg-Id characteristics before and after repeated writing/erasing, respectively.

In the embodiment, the insulating film 7 is a stacked film of an oxide film, a nitride film and an oxide film, an edge of the nitride film being protruding into the insulating film 11, as shown in FIG. 1.

It is thus preferable that a distance $d_2$ between the edge of the nitride film and the interface between the insulating film 11 and the barrier insulating film 12 is longer than 3 nm.

This is because, when the insulating film 7 and the barrier insulating film 12 touch each other, or the distance $d_2=0$, a leak current will be produced between the films 7 and 12 to cause insufficient insulation to the film 7.

The distance $d_2$ longer than 3 nm protects the insulating film 7 and the barrier insulating film 12 from direct tunneling therebetween, thus not cause insufficient insulation to the film 7.

Disclosed next is a method of manufacturing an NAND cell-type EEPROM having the transistor in the first embodiment as a memory cell, with respect to FIGS. 2A to 2D.

Figure 2A:
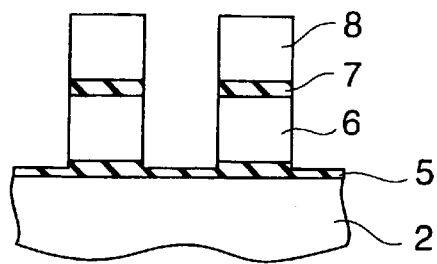
FIGS. 2A to 2D are sectional views to illustrate a method of manufacturing the semiconductor device as the first embodiment.

As illustrated in FIG. 2A, the gate insulating film 5 is formed on a element region of the semiconductor substrate 2, followed by the insulating film 7 (a stacked film of the film 6 of a floating gate material, silicon oxide, silicon nitride and silicon oxide) and a film 8 of a control gate material, formed in this order. Gate electrodes are then formed in the element region by pattering.

Figure 2B:
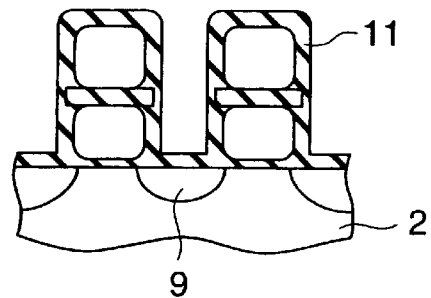

Performed next are post-oxidation for recovery from damage to the device due to gate formation and impurity doping for forming the diffused layer 9, followed by deposition of the silicon oxide film 11 over the entire surface of the semiconductor substrate 2, as illustrated in FIG. 2B.

Figure 2C:
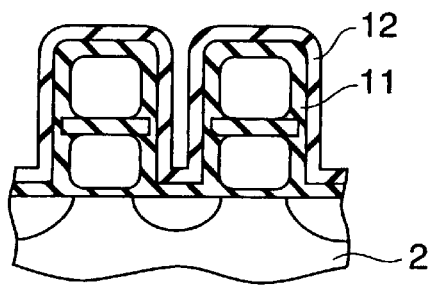

A silicon nitride film 12 is then deposited over the silicon oxide film 11, as illustrated in FIG. 2C by CVD (Chemical Vapor Deposition).

The thickness of the silicon oxide film 11 is adjusted in deposition so that the height $h_1$ of the interface 82 between the silicon oxide film 11 on the diffused layer 9 and the silicon nitride film 12 from the substrate surface is not higher than the height $h_2$ of the interface 84 between the floating electrode 6 and the gate insulating film 5 from the substrate surface.

Figure 2D:
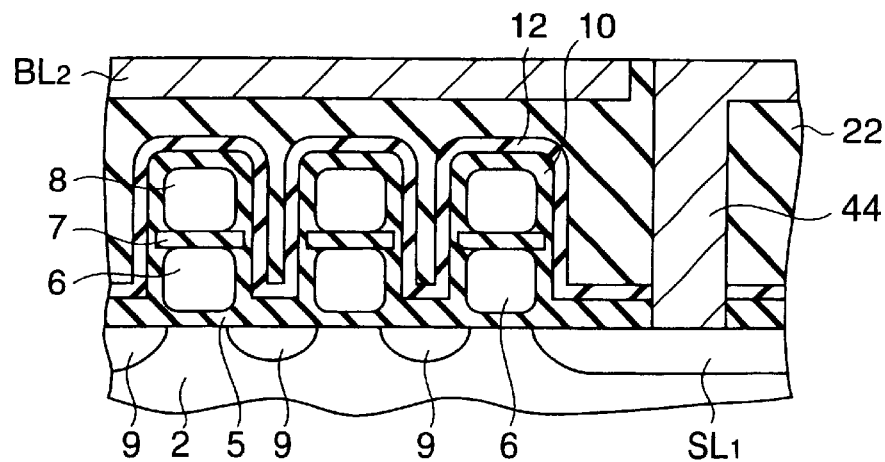

The interlayer dielectric 22 is deposited over the entire surface of the semiconductor substrate 2, followed by formation of several types of contact, such as, a contact 44 in the interlayer dielectric 22 and formation of a wiring $BL_2$ thereon, as illustrated in FIG. 2D, to finish EEPROM manufacturing.

The semiconductor device produced as disclosed above also has the same advantages as discussed to the first embodiment.

The height $h_1$ of the interface 82 from the substrate surface, the distance $d_1$ between the side face of the floating gate electrode 6 and the interface between the insulating film 11 and the barrier insulating film 12, and the distance $d_2$ between the edge surface of the nitride film composing the insulating film 7 and the interface between the films 11 and 12 can be adjusted according to the deposited thickness of the film 11 and the post-oxidation for recovery from damage to the device due to gate formation.

The post-oxidation may be performed after the deposition of the insulating film 11, which is described with reference to FIGS. 18A to 18D.

Figure 18A:
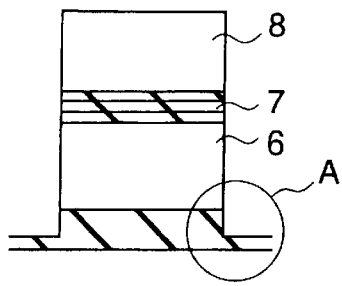
FIGS. 18A to 18D illustrate structure of an inter-film.
Figure 18B:
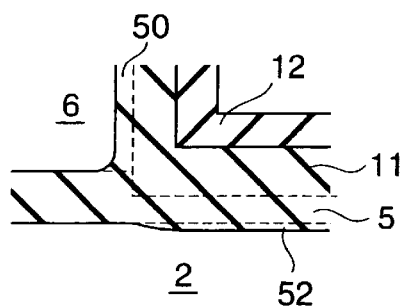
Figure 18C:
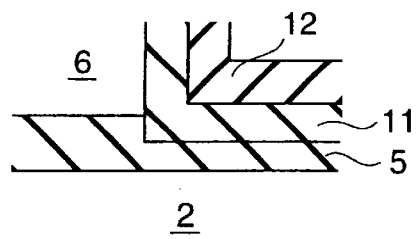
Figure 18D:
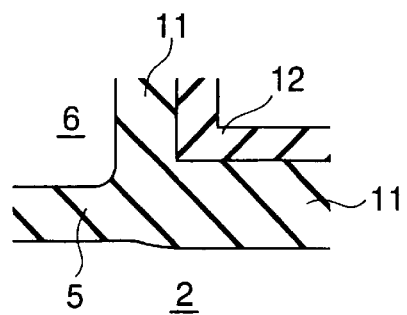

FIG. 18A is a sectional view of the gate electrode processed as already disclosed. FIGS. 18B and 18C are enlarged views, after gate electrode formation, of a gate edge (a circle region "A" in FIG. 18A) formed by the post-oxidation and the succeeding deposition of the insulating film 11. FIG. 18D is an enlarged view of a gate edge after formation of the insulating film 11 by the post-deposition.

FIG. 18B illustrates a regular degree of post-oxidation whereas FIG. 18C illustrates post-oxidation lower than the regular degree or almost no post-oxidation.

Thermal oxide films 50 and 52 shown in FIG. 18B are oxide films formed by the post-oxidation. The oxide films can be adjusted separately according to the conditions for post-oxidation, for formation of the tunnel oxide film or for formation of the floating gate.

In FIG. 18B, the thickness, or height $h_1$, of the inter-film (formed between the diffused layer 9 and the barrier insulating 12) equals to the sum of the thickness of the thermal oxide film 52, tunnel oxide film 5 and insulating film 11. In FIG. 18C, the thickness $h_1$ of the inter-film equals to the sum of the thickness of the tunnel oxide film 5 and insulating film 11. In FIG. 18D, the thickness $h_1$ of the inter-film equals to the insulating film 11.

The Second Preferred Embodiment

Figure 3:
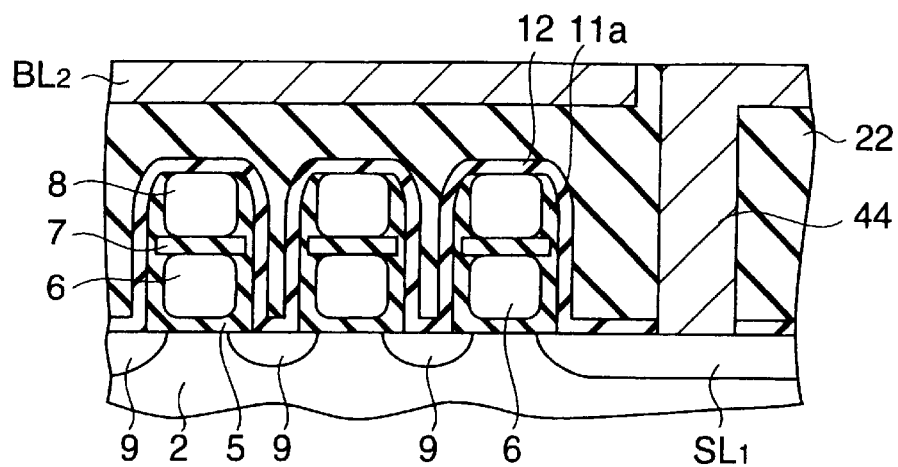
FIG. 3 is a sectional view of a structure of a semiconductor device as the second preferred embodiment according to the present invention.

FIG. 3 illustrates a structure of a semiconductor device as the second preferred embodiment according to the present invention.

This semiconductor device is an NAND cell-type EERPOM having an insulating film 11a, for example, made of a silicon oxide film, formed on the side face of the gate electrode of a transistor that makes up of each memory cell. Each cell is covered with a silicon nitride film 12.

The well-known NAND cell-type EERPOM is provided with the silicon nitride film 12 formed on the diffused layer 9 via the silicon oxide film 5a, as shown in 14.

On the contrary, the silicon nitride film 12 is directly formed on the diffused layer 9 in this embodiment.

Figure 4:
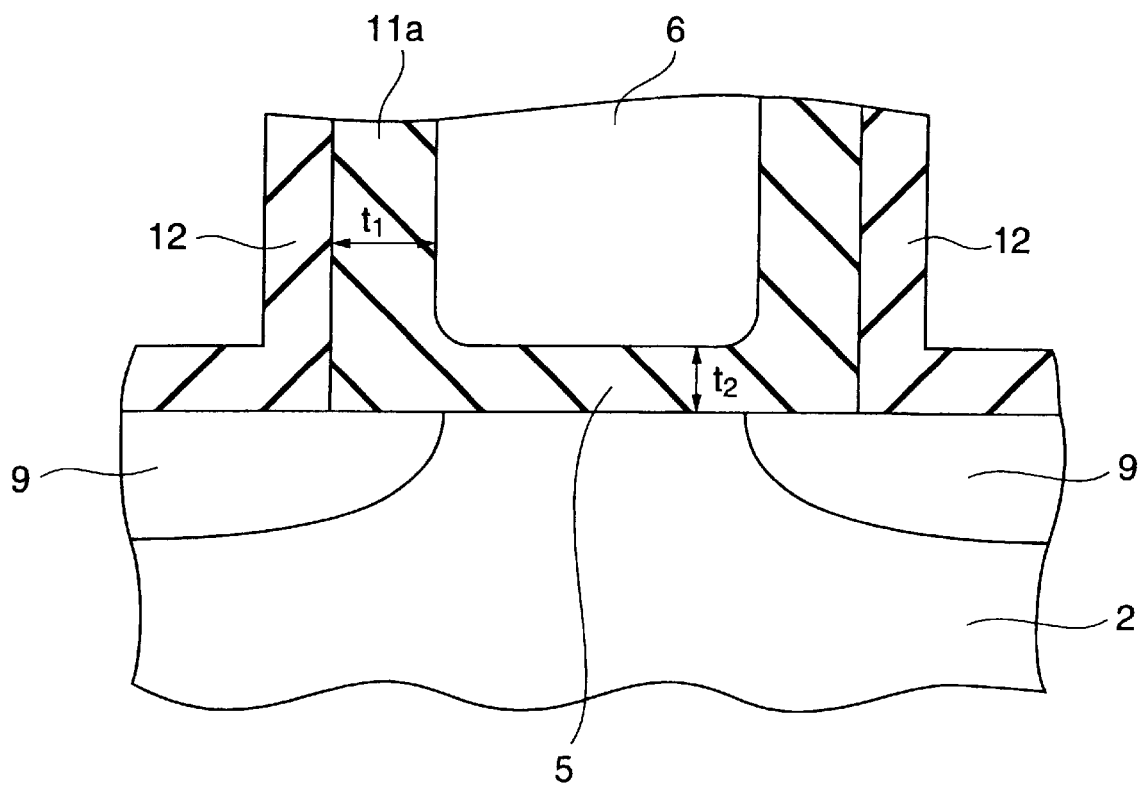
FIG. 4 is a sectional view to illustrate the features of the semiconductor device as the second preferred embodiment.

Moreover, as shown in FIG. 4, an insulating film 11a in the vicinity of the floating gates is formed so that its thickness $t_1$ is thicker than thickness $t_2$ of the gate insulating film 5. This arrangement obstructs carriers to reach the silicon nitride film 12 and the interface between the film 12 and the diffused layer 9, thus preventing increase in parasitic resistance to the diffused layer 9 for maintaining a sufficient driving force of the transistor.

Furthermore, compared to the well-known device, the silicon nitride film 12 of the embodiment is formed as being apart from the gate insulating film 5, thus avoiding degradation of the film 5 to prevent the device from lowering its reliability.

Disclosed next is a method of manufacturing a semiconductor device in the second embodiment with respect to FIGS. 5A to 5D.

Figure 5A:
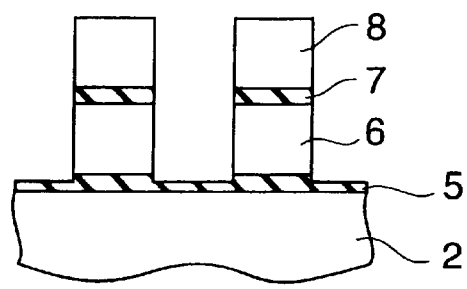
FIGS. 5A to 5D are sectional views to illustrate a method of manufacturing the semiconductor device as the second embodiment.

As illustrated in FIG. 5A, the gate insulating film 5 is formed on a element region of the semiconductor substrate 2, followed by the film 6 of a floating gate material, the insulating film 7 of silicon oxide and a film 8 of a control gate material, formed in this order. Gate electrodes are then formed in the element region by pattering.

Figure 5B:
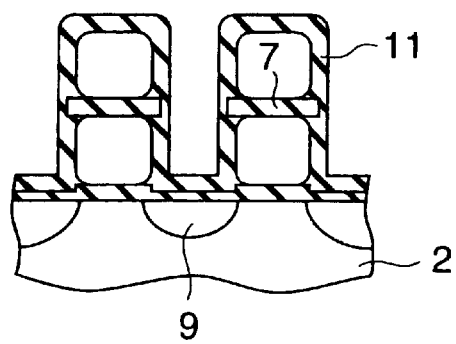

Performed next are post-oxidation for recovery from damage to the device due to gate formation and impurity doping for forming the diffused layer 9, followed by deposition of a silicon oxide film 11 over the entire surface of the semiconductor substrate 2, as illustrated in FIG. 5B.

Figure 5C:
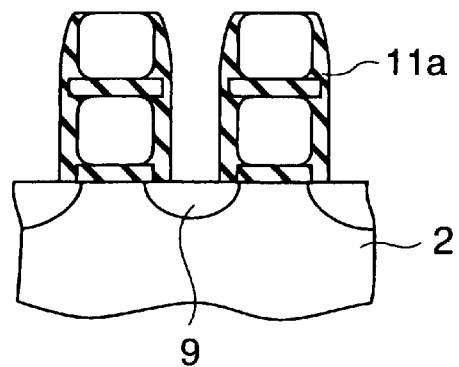

Anisotropic etching, such as, RIE (Reactive Ion Etching) is performed to leave the silicon oxide film only on the side face of the gate electrode to form an insulating film 11a made of the silicon oxide film, as illustrated in FIG. 5C.

Figure 5D:
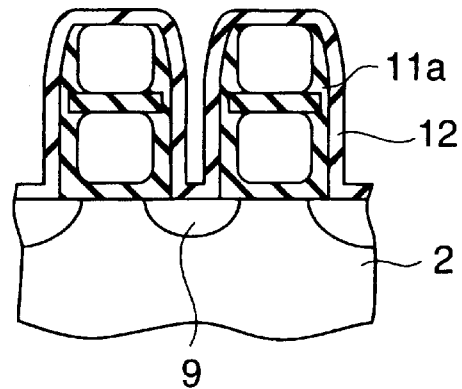

The silicon nitride film 12 is then deposited over the silicon oxide film 11 by CVD, as illustrated in FIG. 5D, followed by deposition of the interlayer dielectric 22 over the entire surface of the semiconductor substrate 2, formation of several types of contact, such as, a contact 44 in the interlayer dielectric 22 and formation of a wiring $BL_2$ thereon, to finish EEPROM manufacturing.

The diffused layer 9 may be formed after the formation of the insulating film 11a. Moreover, the finished device may be an LDD type.

The semiconductor device produced as disclosed above also has the same advantages as discussed to the second embodiment.

The Third Preferred Embodiment

Figure 6:
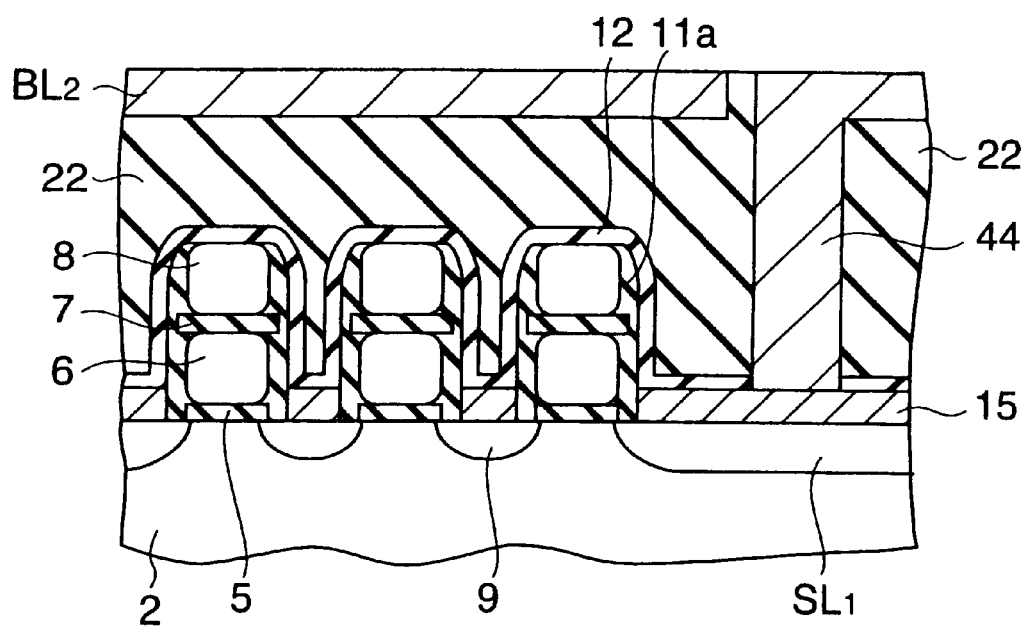
FIG. 6 is a sectional view of a structure of a semiconductor device as the third preferred embodiment according to the present invention.

FIG. 6 illustrates a structure of a semiconductor device as the third preferred embodiment according to the present invention.

The semiconductor device is a NAND cell-type EEPROM having a conductive film 15 between a diffused layer 9 and a silicon nitride film 12 between adjacent memory cells and also between a diffused layer in the bottom of the contact, such as, a diffused layer $SL_1$ and the film 12.

The thickness of the conductive film 15 is adjusted so that the height of the interface between the film 15 and the silicon nitride film 12 from the surface of a semiconductor substrate 2 is higher than the that of the interface between the floating gate 6 and the gate insulating film 5 from the substrate surface.

This arrangement prevents carriers passing through the gate insulating film 5 in writing/erasing from being trapped on the interface between the silicon nitride film 12 and the conductive film 15, thus preventing increase in parasitic resistance to the diffused layer 9 for maintaining a sufficient driving force of the transistor.

Furthermore, compared to the well-known device, the silicon nitride film 12 of the embodiment is formed as being apart from the gate insulating film 5, thus avoiding degradation of the film 5 to prevent the device from lowering its reliability.

Generally, when nitrogen is involved in the gate insulating film 5, it is difficult to form a thick oxide film on the diffused layer by post-oxidation etc.

Even for such a case, the first to the third embodiments offer the structure in that the silicon nitride film 12 is formed as apart from the gate insulating film 5, thus avoiding a transistor driving force from lowering and degradation of the film 5 to prevent the device from lowering its reliability.

Disclosed next is a method of manufacturing a semiconductor device in the third embodiment with respect to FIGS. 7A to 7D.

Figure 7A:
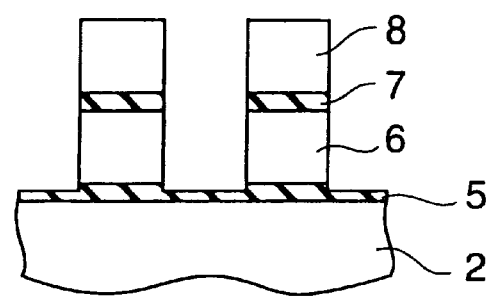
FIGS. 7A to 7D are sectional views to illustrate a method of manufacturing the semiconductor device as the third embodiment.

As illustrated in FIG. 7A, the gate insulating film 5 is formed on a element region of the semiconductor substrate 2, followed by a film 6 of a floating gate material, an insulating film 7 of silicon oxide and a film 8 of a control gate material, formed in this order. Gate electrodes are then formed in the element region by pattering.

Figure 7B:
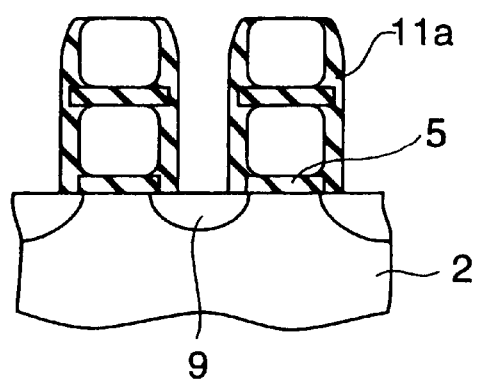

Performed next are post-oxidation for recovery from damage to the device due to gate formation and impurity doping for forming the diffused layer 9, followed by deposition of a silicon oxide film 11 over the entire surface of the semiconductor substrate 2, as illustrated in FIG. 7B.

Figure 7C:
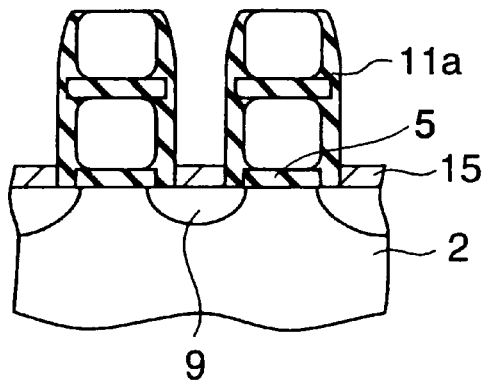

Anisotropic etching, such as, RIE, is performed to form an insulating 11a made of a silicon oxide film on the side face of the gate electrode, as illustrated in FIG. 7C. The insulating 11a is preferably thicker than the gate insulating film 5.

Silicon is selectively grown on the diffused layer 9 followed by doping to the silicon impurities of the same conductive type as the layer 9 to form a conductive film 15, as illustrated in FIG. 7C.

The thickness of the conductive film 15 is preferably, for example, about 3 nm like the depth of the diffused layer 9, with impurity concentration preferably, for example, about $1.0 \times 10^{20}$ cm$^{-3}$, like the layer 9.

Figure 7D:
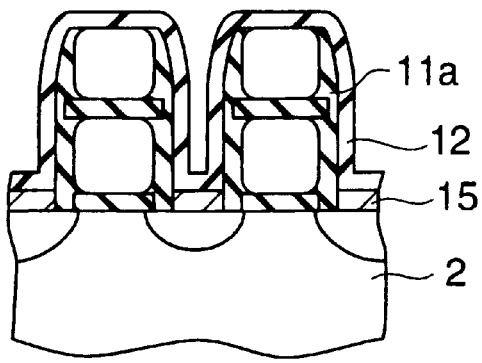

The silicon nitride film 12 is then deposited over the silicon oxide film 11 by CVD, as illustrated in FIG. 7D, followed by deposition of the interlayer dielectric 22, formation of several types of contact, such as, a contact 44 in the dielectric 22 and formation of a wiring $BL_2$ thereon, to finish EEPROM manufacturing.

The diffused layer 9 may be formed after the formation of the insulating film 11a. Moreover, the finished device may be an LDD type.

Like the third embodiment, the semiconductor device produced as disclosed above also prevents transistor driving force from lowering and the gate insulating film 5 from being degraded.

Moreover, the conductive film 15 is the impurity region the same conductive type as the diffused layer 9 in this embodiment; hence forms the source and drain that are located higher than the cannel (the substrate surface under the gate insulating film 5), thus achieving restriction of short channel effect.

In the third embodiment, the silicon film 15 is formed not only over the diffused layer 9 between the adjacent memory cells but also over a diffused layer $SL_1$ connected to a contact 44, as illustrated in FIG. 6.

Figures 8, 9:
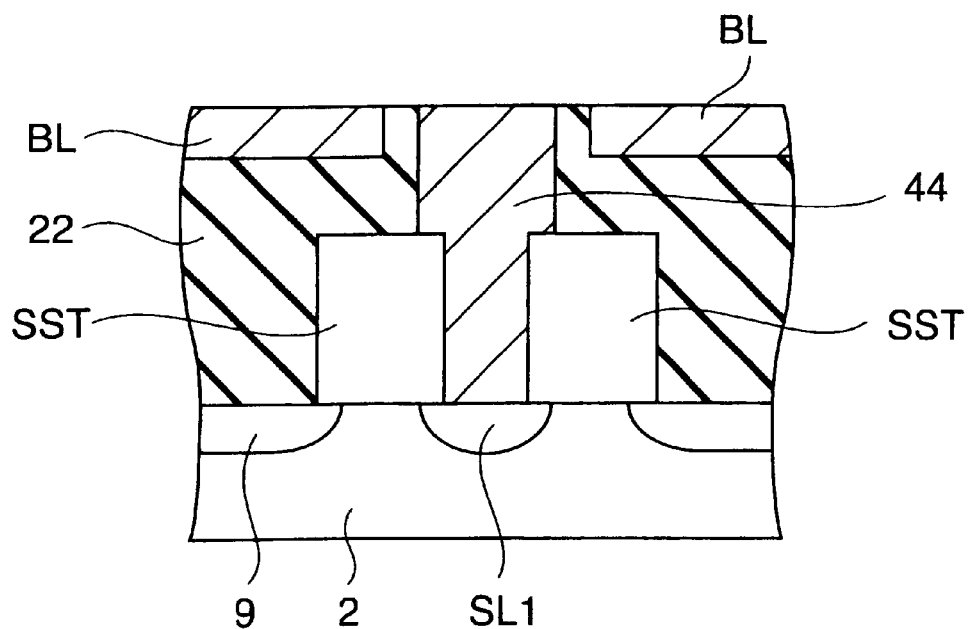
FIG. 8 illustrates a modification to the third embodiment.
FIG. 9 is a sectional view to illustrate a modification to the first to the third embodiments.
Figure 10:
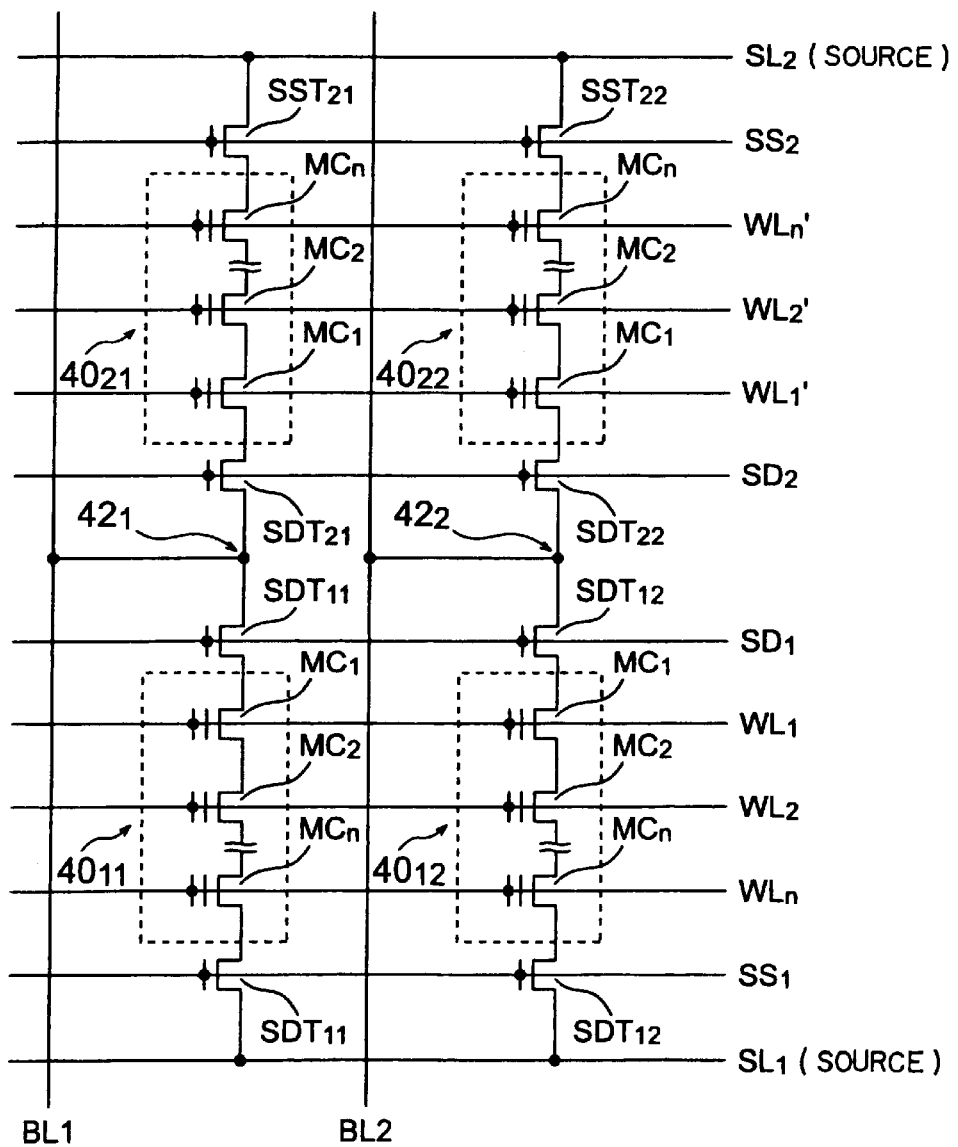
FIG. 10 shows an equivalent circuit of a NAND cell-type EEPROM.
Figure 11:
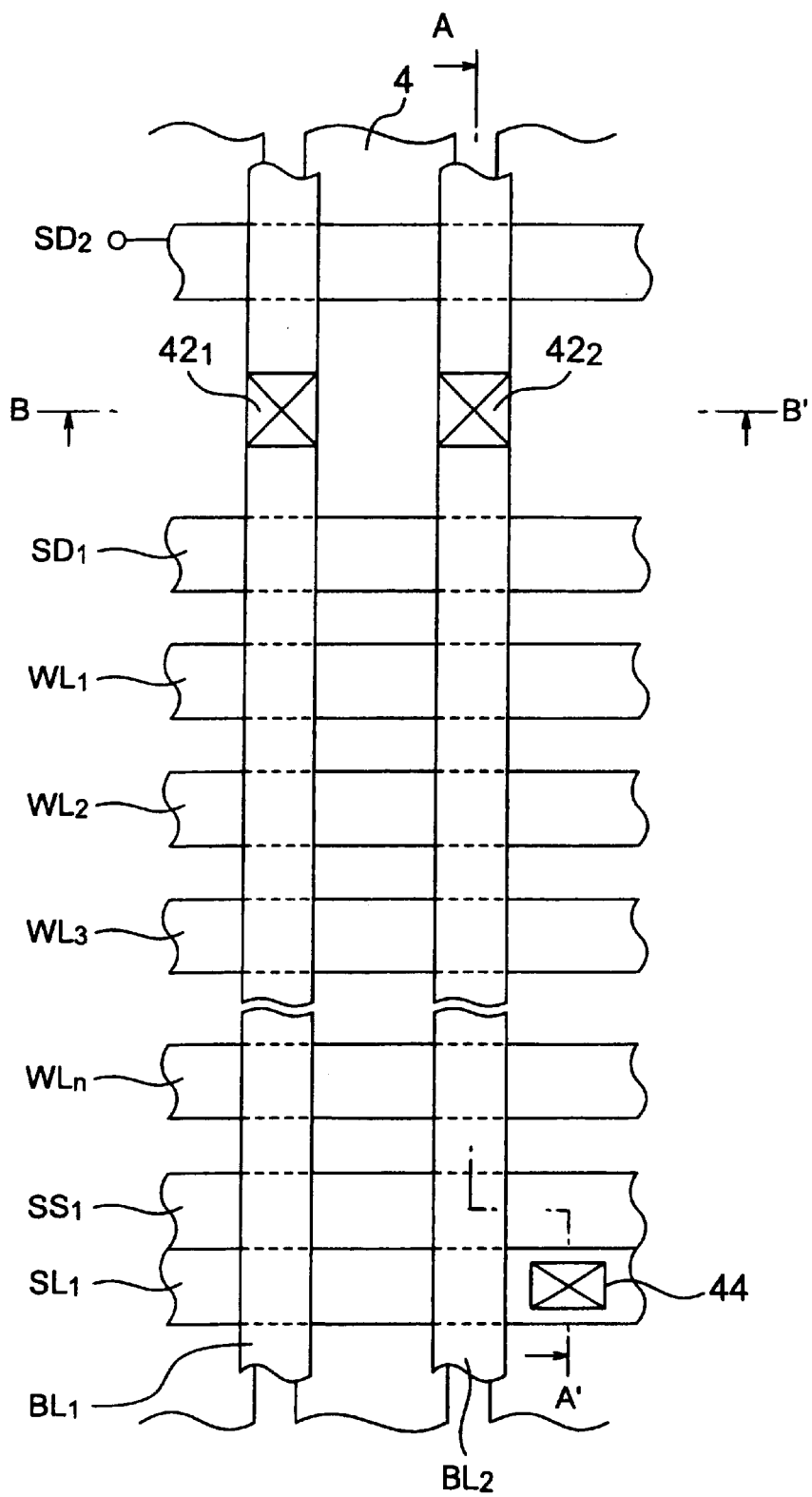
FIG. 11 illustrates a layout of the NAND cell-type EEPROM shown in FIG. 10.
Figure 12:
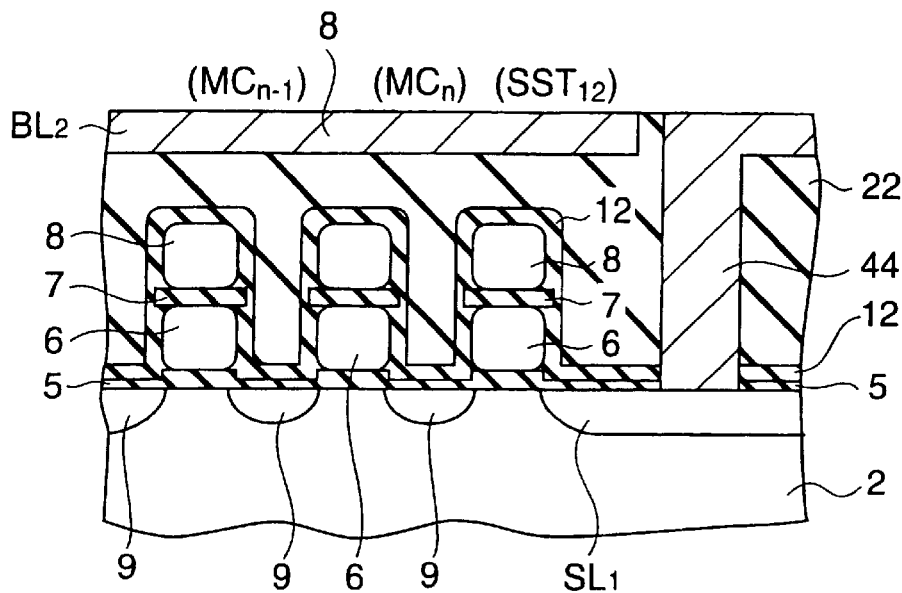
FIG. 12 is a sectional view taken along the line A–A' in FIG. 11.
Figure 13:
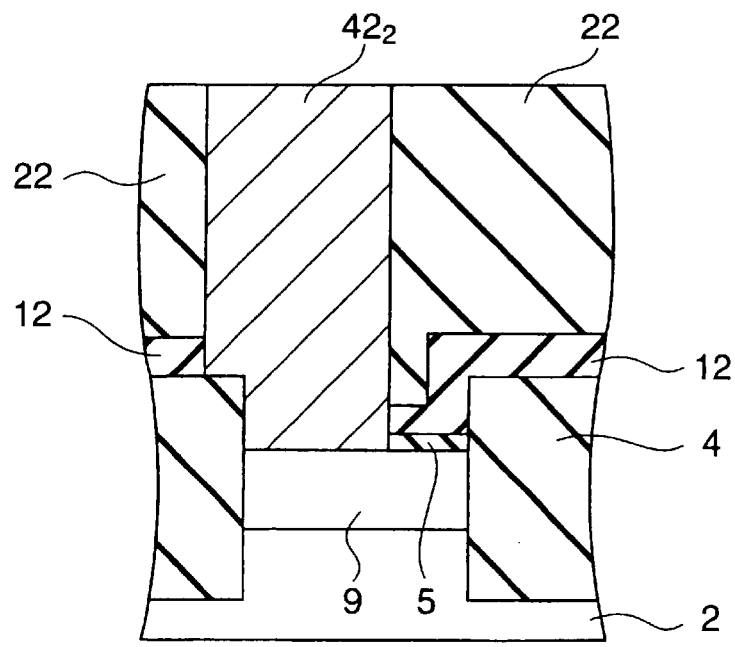
FIG. 13 is a sectional view taken along the line B–B' in FIG. 11.
Figure 14:
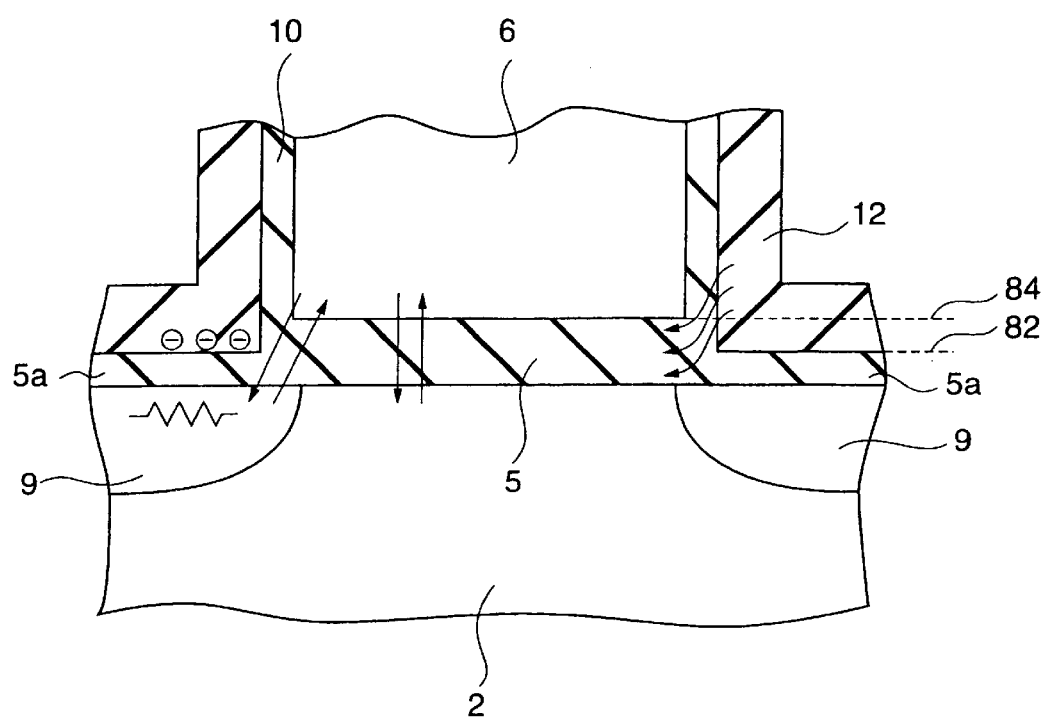
FIG. 14 illustrates drawbacks of a well-known semiconductor device.

In other words, the third embodiment has a structure in that impurities the same conductive type as the diffused layer are doped into the silicon formed between adjacent memory cells and also that formed over the diffused layer at the contact bottom, as shown in 1) of a table of FIG. 8.

Impurities may, however, be doped into the silicon formed on the diffused layer SL1 only, not to that over the diffused layer 9, as shown in 2) of a table of FIG. 8. This arrangement also prevents lowering transistor driving force and degradation of the gate insulating film 5 because of the structure in that the silicon nitride film 12 is formed as apart from the film 5.

Moreover, the silicon grown on the diffused layer may be formed into a silicide with no impurity doping, as shown in 3) of a table of FIG. 8.

As disclosed, in the third embodiment, the conductive film 15 is formed as thicker than the gate insulating film 5 so that the interface between the film 15 and the silicon nitride film 12 from the surface of the semiconductor substrate 2 is higher than that between the floating gate 6 and the film 5 from the substrate surface. The conductive film 15 may, however be formed as thinner than the gate insulating film 5 when the film 15 is made of metal.

When the conductive film 15 is made of an impurity-doped silicon semiconductor film, the advantages like the third embodiment can be offered by doping impurities of high concentration to the film 15 to have thickness so that a depletion layer formed in the film 15 does not reach the diffused layer 9, which would otherwise occur due to the existence of carriers trapped on the interface between the film 15 and the silicon nitride film 12.

This arrangement also offers the conductive film 15 thinner than the counterpart in the third embodiment, with the insulating film 11a preferably thicker than the gate insulating film.

The first to the third embodiments are provided with the contact 44 having a enough margin to the gate. The contact 44 may, however, be formed in self-alignment to the gate of a selection transistor SST, as illustrated in FIG. 9.

The first to the third embodiments are disclosed with a NAND cell-type EEPROM, however, applicable to other memory types, such as, AND-type EEPROM and NOR-type EEPROM.

Moreover, each memory cell includes a transistor having a double-layer gate in the embodiments. The memory cell may, however, be an MNOS-type or MONOS-type EEPROM having a one-layer gate and a gate insulating film which is stacked of a silicon oxide film and a silicon nitride film.

As disclosed above, the present invention achieves prevention of lowering in transistor driving force and transistor-performance reliability.

What is claimed is:

1. A semiconductor device comprising:
   a semiconductor substrate;
   an element region and an element isolation region formed on said semiconductor substrate;
   a plurality of memory cell transistors formed on said element region, each of said plurality of memory cell transistors including a gate insulating film formed on the element region in the semiconductor substrate, a gate electrode formed on the gate insulating film, and a diffused layer in element regions on both sides of the gate electrode, said plurality of memory cell transistors being connected in series between a source line terminal and a bit line terminal to share the diffused layer between adjacent memory cell transistors;
   an inter-film formed so as to contact top and side faces of each of said memory cell transistors without interruption; and
   a barrier insulating film formed on the inter-film;
   wherein a distance between a side face of the gate electrode and the barrier insulating film is larger than a thickness of the gate insulating film.

2. The semiconductor device according to claim 1, wherein the semiconductor substrate is made of silicon, the barrier insulating film is made of silicon nitride and the inter-film is made of silicon oxide.

3. The semiconductor device according to claim 1, comprising a selection transistor arranged between a memory cell and the source line terminal or the bit line terminal, the memory cell having the plurality of memory cell transistors connected in series between the source line terminal and the bit line terminal to share the diffused layer between adjacent memory cell transistors,
   wherein the barrier insulating film covers continuously the plurality of memory cell transistors of the memory cell and the selection transistor.

4. The semiconductor device according to claim 1, wherein the barrier insulating film is also formed on the element isolation region and protects the element isolation region in the case of contact formation.

5. The semiconductor device according to claim 1, wherein the transistor is a transistor constituting a memory cell of an NAND EEPROM.

6. The semiconductor device according to claim 1, wherein the gate insulating film is made of silicon oxide involving nitrogen.

7. The semiconductor device according to claim 1, wherein the gate insulating film is a stacked film of a silicon oxide film and a silicon nitride film.

8. The semiconductor device according to claim 1, wherein the gate electrode is comprised of a first and a second gate electrode, and a first insulating film being formed between the first and the second gate electrode, and wherein a distance between a side face of the first insulating film and the barrier insulating film is 3 nm or more.

9. The semiconductor device according to claim 8, wherein the first insulating film is a stack film including a silicon nitride film, and a distance between a side face of the silicon nitride film and the barrier insulating film is 3 nm or more.

10. A semiconductor device comprising:
    a semiconductor substrate;
    an element region and an element isolation region formed on said semiconductor substrate;
    a plurality of memory cell transistors formed on said element region, each of said plurality of memory cell transistors including a gate insulating film formed on the element region in the semiconductor substrate, a gate electrode formed on the gate insulating film, and a diffused layer in element regions on both sides of the gate electrode, said plurality of memory cell transistors being connected in series between a source line terminal and a bit line terminal to share the diffused layer between adjacent memory cell transistors;
    an inter-film having a first and a second part contacting a top and side face of each of said memory cell transistors respectively, the first part and the second part being continuous; and
    a barrier insulating film formed on the inter-film, wherein a distance between a side face of the gate electrode and the barrier insulating film is larger than a thickness of the gate insulating film.

11. The semiconductor device according to claim 10, wherein the semiconductor substrate is made of silicon, the barrier insulating film is made of silicon nitride and the inter-film is made of silicon oxide.

12. The semiconductor device according to claim 10, comprising a selection transistor arranged between a memory cell and the source line terminal or the bit line terminal, the memory cell including the plurality of memory cell transistors connected in series between the source line terminal and the bit line terminal to share the diffused layer between adjacent memory cell transistors, wherein the barrier insulating film covers continuously the plurality of memory cell transistors of the memory cell and the selection transistor.

13. The semiconductor device according to claim 10, wherein the barrier insulating film is also formed on the element isolation region and protects the element isolation region in the case of contact formation.

14. The semiconductor device according to claim 10, wherein the transistor is a transistor constituting a memory cell of an NAND EEPROM.

15. The semiconductor device according to claim 10, wherein the gate insulating film is made of silicon oxide involving nitrogen.

16. The semiconductor device according to claim 10, wherein the gate insulating film is a stacked film of a silicon oxide film and a silicon nitride film.

17. The semiconductor device according to claim 10, wherein the gate electrode is comprised of a first and a second gate electrode, and a first insulating film formed between the first and the second gate electrode, and wherein a distance between a side face of the first insulating film and the barrier insulating film is 3 nm or more.

18. The semiconductor device according to claim 17, wherein the first insulating film is a stack film including a silicon nitride film, and a distance between a side face of the silicon nitride film and the barrier insulating film is 3 nm or more.

* * * * *